(12) United States Patent
Horstman et al.

(10) Patent No.: US 8,921,495 B2
(45) Date of Patent: *Dec. 30, 2014

(54) HIGH REFRACTIVE INDEX COMPOSITIONS CONTAINING RESIN-LINEAR ORGANOSILOXANE BLOCK COPOLYMERS

(75) Inventors: John Bernard Horstman, Midland, MI (US); Steven Swier, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/822,140

(22) PCT Filed: Sep. 22, 2011

(86) PCT No.: PCT/US2011/052751
§ 371 (c)(1),
(2), (4) Date: Mar. 11, 2013

(87) PCT Pub. No.: WO2012/040457
PCT Pub. Date: Mar. 29, 2012

(65) Prior Publication Data
US 2013/0172496 A1 Jul. 4, 2013

Related U.S. Application Data

(60) Provisional application No. 61/537,756, filed on Sep. 22, 2011, provisional application No. 61/537,774, filed on Sep. 22, 2011, provisional application No. 61/537,146, filed on Sep. 21, 2011, provisional application No. 61/537,151, filed on Sep. 21, 2011, provisional application No. 61/385,446, filed on Sep. 22, 2010.

(51) Int. Cl.
| | | |
|---|---|---|
| C08G 77/44 | (2006.01) | |
| C08G 77/48 | (2006.01) | |
| H01L 23/29 | (2006.01) | |
| C08G 77/14 | (2006.01) | |
| C08G 77/54 | (2006.01) | |
| C08G 77/26 | (2006.01) | |
| C08G 77/00 | (2006.01) | |
| C08G 77/04 | (2006.01) | |
| C08G 77/16 | (2006.01) | |

(52) U.S. Cl.
CPC ............ *C08G 77/44* (2013.01); *H01L 23/296* (2013.01); *C08G 77/14* (2013.01); *C08G 77/54* (2013.01); *C08G 77/80* (2013.01); *C08G 77/48* (2013.01); *C08G 77/04* (2013.01); *C08G 77/70* (2013.01); *C08G 77/16* (2013.01); *C08G 77/26* (2013.01)
USPC .......................................................... 525/477

(58) Field of Classification Search
None
See application file for complete search history.

(56) References Cited

U.S. PATENT DOCUMENTS

| | | | |
|---|---|---|---|
| 3,294,718 A | | 12/1966 | Antonen |
| 3,294,737 A | | 12/1966 | Krantz |
| 3,308,203 A | | 3/1967 | Metevia et al. |
| 3,328,481 A | * | 6/1967 | Vincent ........................ 525/477 |
| 3,436,439 A | | 4/1969 | Woods et al. |
| 3,440,262 A | | 4/1969 | Culpepper |
| 3,576,905 A | * | 4/1971 | McKellar et al. ............... 528/34 |
| 3,619,229 A | * | 11/1971 | Hartlein ........................ 523/209 |
| 3,629,228 A | * | 12/1971 | Hartlein et al. ................. 528/17 |
| 3,632,793 A | | 1/1972 | Antonen |
| 3,636,134 A | | 1/1972 | Antonen |
| 3,639,155 A | | 2/1972 | Hartlein et al. |
| 3,647,846 A | * | 3/1972 | Hartlein et al. ............... 556/436 |
| 3,670,649 A | * | 6/1972 | Hartlein et al. ............... 102/431 |
| 4,340,709 A | | 7/1982 | Jeram et al. |
| 4,356,293 A | | 10/1982 | Beubzer et al. |
| 4,419,402 A | * | 12/1983 | Gutek ........................... 442/145 |
| 4,443,502 A | * | 4/1984 | Gutek ........................... 427/387 |
| 4,508,887 A | | 4/1985 | Kohl |
| 4,585,670 A | | 4/1986 | Liu |
| 5,075,103 A | | 12/1991 | Halloran et al. |
| 5,145,933 A | | 9/1992 | Grisoni et al. |
| 5,830,950 A | | 11/1998 | Katsoulis et al. |

(Continued)

FOREIGN PATENT DOCUMENTS

| | | |
|---|---|---|
| CN | 101484503 A | 7/2009 |
| CN | 101792529 A | 8/2010 |

(Continued)

OTHER PUBLICATIONS

"European Application No. 11767349.1, Communication Pursuant to Rules 161(1) and 162 EPC mailed May 2, 2013", 2 pgs.

(Continued)

*Primary Examiner* — Robert S Loewe
(74) *Attorney, Agent, or Firm* — Schwegman Lundberg & Woessner, P.A.

(57) ABSTRACT

Solid compositions of organosiloxane block copolymers are disclosed having a refractive index greater than 1.5. The organosiloxane block copolymers comprise: 40 to 90 mole percent disiloxy units of the formula $[R^1{}_2SiC_{2/2}]$ 9 10 to 60 mole percent trisiloxy units of the formula $[R^2SiO_{3/2}]$ 0.5 to 35 mole percent silanol groups [≡SiOH] where $R^1$ is independently a $C_1$ to $C_{30}$ hydrocarbyl, $R^2$ is independently a $C_1$ to $C_{20}$ hydrocarbyl, wherein; the disiloxy units $[R^1{}_2SiC_{2/2}]$ are arranged in linear blocks having an average of from 10 to 400 disiloxy units $[R^1{}_2SiC_{2/2}]$ per linear block, the trisiloxy units $[R^1{}_2SiC_{3/2}]$ are arranged in non-linear blocks having a molecular weight of at least 500 g/mol, and at least 30% of the non-linear blocks are crosslinked with each other, each linear block is linked to at least one non-linear block, and the organosiloxane block copolymer has a molecular weight ($M_w$) of at least 20,000 g/mole.

12 Claims, 2 Drawing Sheets

(56) References Cited

U.S. PATENT DOCUMENTS

| | | | |
|---|---|---|---|
| 5,981,670 | A | 11/1999 | Itoh et al. |
| 6,020,409 | A | 2/2000 | Alvarez et al. |
| 6,803,409 | B2 | 10/2004 | Keryk et al. |
| 7,312,008 | B2 * | 12/2007 | Wu et al. .................. 430/66 |
| 8,222,352 | B2 | 7/2012 | Hirano |
| 2005/0180712 | A1 * | 8/2005 | Shelnut et al. .............. 385/129 |
| 2008/0042142 | A1 | 2/2008 | Sugawara et al. |
| 2009/0318725 | A1 | 12/2009 | Takeuchi |
| 2013/0165602 | A1 | 6/2013 | Horstman et al. |
| 2013/0168727 | A1 | 7/2013 | Horstman et al. |
| 2013/0171354 | A1 | 7/2013 | Horstman et al. |
| 2013/0245187 | A1 | 9/2013 | Swier et al. |

FOREIGN PATENT DOCUMENTS

| | | |
|---|---|---|
| JP | 48-11211 B1 | 4/1973 |
| JP | 48-042720 B1 | 12/1973 |
| JP | 49-027120 B1 | 7/1974 |
| JP | 49-44937 B1 | 11/1974 |
| JP | 50-36256 B1 | 11/1975 |
| JP | 52-008360 B1 | 3/1977 |
| JP | 53-013680 B1 | 5/1978 |
| JP | 54-83957 A | 7/1979 |
| JP | 56-000827 A | 1/1981 |
| JP | 56-110730 A | 9/1981 |
| JP | 60-053539 A | 3/1985 |
| JP | 08-012761 A | 1/1996 |
| JP | 10-237174 A | 9/1998 |
| JP | 11-021353 A | 1/1999 |
| JP | 2005-527689 A | 9/2005 |
| JP | 2006-022207 A | 1/2006 |
| JP | 2006-206721 A | 8/2006 |
| JP | 2010-100667 A | 5/2010 |
| JP | 2010-116462 A | 5/2010 |
| JP | 2011-190413 A | 9/2011 |
| WO | WO-97/07164 A1 | 2/1997 |
| WO | WO-2009/114190 A2 | 9/2009 |
| WO | WO-2010/051355 A2 | 5/2010 |
| WO | WO-2012/040302 A1 | 3/2012 |
| WO | WO-2012/040305 A1 | 3/2012 |
| WO | WO-2012/040367 A1 | 3/2012 |
| WO | WO-2012/040453 A1 | 3/2012 |

OTHER PUBLICATIONS

"European Application No. 11767349.1, Communication Under Rule 71(3) EPC—Intention to Grant dated Jan. 30, 2014", 7 pgs.
"European Application No. 11767349.1, Response to Official Communication Issued Pursuant to Rules 161(1) and 162 EPC mailed Nov. 12, 2013", 9 pgs.
"European Application Serial No. 11761801.7, Examination Notification Art. 94(3) mailed Jan. 15, 2014", 6 pgs.
"European Application Serial No. 11761808.2, Examination Notification Art. 94(3) mailed Jan. 15, 2014", 5 pgs.
"International Application Serial No. PCT/US2011/052513, International Preliminary Report on Patentability mailed Apr. 4, 2013", 8 pgs.
"International Application Serial No. PCT/US2011/052513, International Search Report mailed Nov. 24, 2011", 3 pgs.
"International Application Serial No. PCT/US2011/052513, Written Opinion mailed Nov. 24, 2011", 7 pgs.
"International Application Serial No. PCT/US2011/052518, International Preliminary Report on Patentability mailed Apr. 4, 2013", 7 pgs.
"International Application Serial No. PCT/US2011/052518, International Search Report mailed Nov. 24, 2011", 3 pgs.
"International Application Serial No. PCT/US2011/052518, Written Opinion mailed Nov. 24, 2011", 5 pgs.
"International Application Serial No. PCT/US2011/052615, International Preliminary Report on Patentability mailed Apr. 4, 2013", 10 pgs.
"International Application Serial No. PCT/US2011/052615, Written Opinion mailed Dec. 2, 2011", 8 pgs.
"International Application Serial No. PCT/US2011/052747, International Preliminary Report on Patentability mailed Apr. 4, 2013", 7 pgs.
"International Application Serial No. PCT/US2011/052747, Written Opinion mailed Nov. 24, 2011", 5 pgs.
"International Application Serial No. PCT/US2011/052751, International Preliminary Report on Patentability mailed Apr. 4, 2013", 7 pgs.
"International Application Serial No. PCT/US2011/052751, Written Opinion mailed Nov. 24, 2011", 5 pgs.
"International Application No. PCT/US2011/052513, International Search Report mailed Nov. 24, 2011", 3 pgs.
"International Application No. PCT/US2011/052518, International Search Report mailed Nov. 24, 2011", 3 pgs.
"International Application No. PCT/US2011/052615, International Search Report mailed Dec. 2, 2011", 4 pgs.
"International Application No. PCT/US2011/052747, International Search Report mailed Nov. 24, 2011", 3 pgs.
"International Application No. PCT/US2011/052751, International Search Report mailed Nov. 24, 2011", 4 pgs.
"Silicones", Encyclopedia of Polymer Science and Technology, Wiley, US (XP007918236), (Apr. 15, 2003), 765-841.
Su, Kai, et al., "Siloxane Materials for Optical Applications", Proceedings of the SPIE, The International Society for Optical Engineering SPIE, USA, vol. 6029 (XP002429343), (Jan. 20, 2006), 1-8.
"10. Block Copolymers", [online]. Retrieved from the Internet: <URL: www.polymer.ph.tum.de/fileadmin/w00bhn/www/PDF/Vorlesungen/2013_SS/Polymerphysik2/chapter10_01.pdf>, (2013), 16 pgs.
"U.S. Appl. No. 13/822,099, Non Final Office Action mailed Apr. 2, 2014", 7 pgs.
"U.S. Appl. No. 13/822,113, Non Final Office Action mailed May 13, 2014", 6 pgs.
"U.S. Appl. No. 13/822,122, Non Final Office Action mailed Apr. 14, 2014", 4 pgs.
"U.S. Appl. No. 13/822,122, Response filed Jul. 14, 2014 to Non Final Office Action mailed Apr. 14, 2014", 9 pgs.
"Chinese Application Serial No. 201180053363.6, Office Action mailed Apr. 10, 2014", (w/ English Translation), 12 pgs.
"Chinese Application Serial No. 201180053366.X, Office Action mailed Apr. 10, 2014", (w/ English Translation), 13 pgs.
"Chinese Application Serial No. 201180053369.3, Office Action mailed Mar. 31, 2014", (w/ English Translation), 13 pgs.
"Chinese Application Serial No. 201180053369.3, Voluntary Amendment filed Oct. 24, 2013", (w/ English Translation of Claims), 55 pgs.
"Chinese Application Serial No. 201180053371.0, Office Action mailed Jun. 9, 2014", (w/ English Translation), 11 pgs.
"Chinese Application Serial No. 201180053371.0, Voluntary Amendment filed Oct. 28, 2013",(w/ English Translation of Claims), 41 pgs.
"European Application Serial No. 11761801.7, Office Action mailed May 15, 2014", 4 pgs.
"European Application Serial No. 11761801.7, Response filed Apr. 17, 2014 to Office Action mailed Jan. 15, 2014", 9 pgs.
"European Application Serial No. 11761802.5, Office Action mailed May 5, 2013", 2 pgs.
"European Application Serial No. 11761802.5, Response filed Nov. 11, 2013 to Office Action mailed May 2, 2013", 17 pgs.
"European Application Serial No. 11761808.2, Response filed May 14, 2014 to Office Action mailed Jan. 15, 2014", 55 pgs.
"European Application Serial No. 11767348.3, Office Action mailed May 2, 2013", 2 pgs.
"European Application Serial No. 11767348.3, Response filed Nov. 11, 2013 to Office Action mailed May 2, 2013", 12 pgs.
"European Application Serial No. 11767349.1, Office Action mailed May 2, 2013", 2 pgs.
"European Application Serial No. 11767349.1, Response filed Nov. 12, 2013 to Office Action mailed May 2, 2013", 13 pgs.
"Japanese Application Serial No. 2013-529430, Office Action mailed Apr. 22, 2014", (w/ English Translation), 11 pgs.

(56) References Cited

OTHER PUBLICATIONS

"Japanese Application Serial No. 2013-529434, Office Action mailed Mar. 11, 2014", w/ English Translation), 6 pgs.

"Japanese Application Serial No. 2013-529444, Office Action mailed Apr. 22, 2014", (w/ English Translation), 8 pgs.

"Japanese Application Serial No. 2013-529445, Office Action mailed Mar. 11, 2014", (w/ English Translation), 4 pgs.

"Japanese Application Serial No. 2013529429, Office Action mailed Mar. 4, 2014", (w/ English Translation), 7 pgs.

"Korean Application Serial No. 10-2013-7010239, Amendment filed Apr. 2, 2014", 11 pgs.

"Korean Application Serial No. 10-2013-7010239, Notice of Preliminary Rejection mailed May 30, 2014", (w/ English Summary), 6 pgs.

"Korean Application Serial 10-2013-7010245, Amendment filed Mar. 19, 2014", 6 pgs.

"Korean Application Serial No. 10-2013-7010245, Notice of Preliminary Rejection mailed May 30, 2014", (w/ English Summary), 4 pgs.

"Machine Translation of JP 08-012761A published Jan. 16, 1996", 10 pgs.

"Machine Translation of JP 48-42720, published Dec. 14, 1973", 8 pgs.

Bahadur, Pratap, "Block copolymers—Their microdomain formation (in solid state) and surfactant behaviour (in solution)", *Current Science*, 80(8), (2001), 1002-1007.

Quirk, Roderic P., et al., "Chapter 12—Polyester Thermoplastic Elastomers: Part I", *In: Handbook of Elastomers*, Second Edition, Revised and Expanded, Bhowmick, A. K., et al., Editors, Marcel Dekker, Inc., New York, NY, (2001), 353-365.

\* cited by examiner

AFM of a thin film of a representative resin-linear organosiloxane block copolymer showing dispersed nano-size particles A rheology curve of a representative resin-linear organosiloxane block copolymer demonstrating "reprocessabililty" behavior

HIGH REFRACTIVE INDEX COMPOSITIONS CONTAINING RESIN-LINEAR ORGANOSILOXANE BLOCK COPOLYMERS

CROSS-REFERENCE TO RELATED APPLICATIONS

This application is a national stage application under 35 U.S.C. §371 of PCT/US2011/052751, filed Sep. 22, 2011, and published as WO 2012/040457 A1 on Mar. 29, 2012, which claims the benefit of priority to U.S. Application No. 61/385,446 as filed on 22 Sep., 2010, U.S. Application No. 61/537,146 as filed on 21 Sep., 2011, U.S. Application No. 61/537,151 as filed on 21 Sep., 2011, U.S. Application No. 61/537,756 as filed on 22 Sep., 2011, and US Application No. 61/537,774 as filed on 22 Sep., 2011, which applications and publication are incorporated by reference as if reproduced herein and made a part hereof in their entirety, and the benefit of priority of each of which is claimed herein.

BACKGROUND OF THE INVENTION

There is a continuing need to identify protective and/or functional coatings in many areas of emerging technologies. For example, most light emitting diodes (LEDs) and solar panels use an encapsulant coating to protect photovoltaic cells from environmental factors. Such protective coatings must be optically clear to ensure maximum efficiency of these devices. Furthermore, these protective coatings must also be tough, durable, long lasting, and yet easy to apply. Various silicone based compositions are known in the art as protective coatings in various electronics and solar devices since silicones are known for their durability.

Many of the silicone compositions used to provide protective electronic coatings today rely on cure mechanisms that require a catalyst in the product compositions. For example, platinum metal catalyzed cure of a silicone composition containing an alkenyl functional organopolysiloxane and an organohydrogensiloxane are very prevalent in the art. However, the subsequent coatings resulting from these hydrosilylation cured systems still have trace amounts of catalyst remaining in the final product. Furthermore, the cure chemistry requires a certain amount of hydrocarbon groups be present on the siloxane polymers. Both the residual catalyst, and presence of hydrocarbon crosslinks may limit the thermal stability and/or long term durability of such coatings.

Thus, there is a need to identify silicone based encapsulants that are optically clear while remaining tough and durable. In particular, there is a need to identify such silicone based coatings that provide convenience of use in the manufacture of various electronic or lighting devices. Ideally, the silicone composition should be considered to be "reprocessable", in that an initial coating can reflow around device architectures. Also, the coatings or other solid materials may be initially formed from a silicone composition having certain physical properties, but possess sufficient reactivity to further cure to provide coatings with another set of physical properties.

BRIEF SUMMARY OF THE INVENTION

The present disclosure relates to solid compositions comprising an organosiloxane block copolymer having a refractive index greater than 1.5. The present disclosure provides solid compositions comprising an organosiloxane block copolymer having 40 to 90 mole percent disiloxy units of the formula $[R^1_2SiO_{2/2}]$ 10 to 60 mole percent trisiloxy units of the formula $[R^2SiO_{3/2}]$ 0.5 to 25 mole percent silanol groups [≡SiOH]

where R' is independently a $C_1$ to $C_{30}$ hydrocarbyl, $R^2$ is independently a $C_1$ to $C_{20}$ hydrocarbyl, wherein;

the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mol, at least 30% of the non-linear blocks are crosslinked with each other, and are predominately aggregated together in nano-domains, each linear block is linked to at least one non-linear block, the organosiloxane block copolymer has a molecular weight of at least 20,000 g/mole, and the solid composition has a refractive index greater than 1.5.

DETAILED DESCRIPTION OF THE INVENTION

Figure 1:
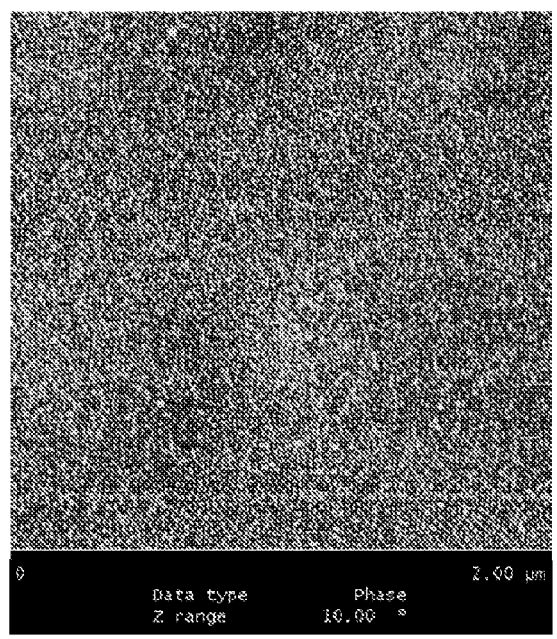
FIG. 1—AFM of a thin film of a representative resin-linear organosiloxane block, showing dispersed nano-size particles.

The present disclosure relates to solid compositions having a refractive index greater than 1.5, as derived from certain organosiloxane block copolymers. These organosiloxane block copolymers comprise:

40 to 90 mole percent disiloxy units of the formula $[R^1_2SiO_{2/2}]$ 10 to 60 mole percent trisiloxy units of the formula $[R^2SiO_{3/2}]$ 0.5 to 35 mole percent silanol groups [≡SiOH]

where $R^1$ is independently a $C_1$ to $C_{30}$ hydrocarbyl, $R^2$ is independently a $C_1$ to $C_{20}$ hydrocarbyl, wherein;

the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mol, and at least 30% of the non-linear blocks are crosslinked with each other, each linear block is linked to at least one non-linear block, and the organosiloxane block copolymer has a molecular weight of at least 20,000 g/mole.

The present disclosure relates to organopolysiloxanes that are described herein as "resin-linear" organosiloxane block copolymers. Organopolysiloxanes are polymers containing siloxy units independently selected from $(R_3SiO_{1/2})$, $(R_2SiO_{2/2})$, $(RSiO_{3/2})$, or $(SiO_{4/2})$ siloxy units, where R may be any organic group. These siloxy units are commonly referred to as M, D, T, and Q units respectively. These siloxy units can be combined in various manners to form cyclic, linear, or branched structures. The chemical and physical properties of the resulting polymeric structures vary depending on the number and type of siloxy units in the organopolysiloxane. "Linear" organopolysiloxanes typically contain mostly D or $(R_2SiO_{2/2})$ siloxy units, which results in polydiorganosiloxanes that are fluids of varying viscosity, depending on the "degree of polymerization" or DP as indicated by the number of D units in the polydiorganosiloxane. "Linear" organopolysiloxanes typically have glass transition temperatures ($T_g$) that are lower than 25° C. "Resin" organopolysiloxanes result when a majority of the siloxy units are selected from T or Q siloxy units. When T siloxy units are predominately used to prepare an organopolysiloxane, the resulting organosiloxane is often referred to as a "silsesquioxane resin". Increasing the amount of T or Q siloxy units in an organopolysiloxane typically results in polymers having increasing hardness and/or glass like properties. "Resin" organopolysiloxanes thus have higher $T_g$ values, for example siloxane resins often have $T_g$ values greater than 50° C.

As used herein "resin-linear organosiloxane block copolymers" refer to organopolysiloxanes containing "linear" D siloxy units in combination with "resin" T siloxy units. The present organosiloxane copolymers are "block" copolymers, as opposed to "random" copolymers. As such, the present "resin-linear organosiloxane block copolymers" refer to organopolysiloxanes containing D and T siloxy units, where the D units are primarily bonded together to form polymeric chains having 10 to 400 D units, which are referred herein as "linear blocks". The T units are primarily bonded to each other to form branched polymeric chains, which are referred to as "non-linear blocks". A significant number of these non-linear blocks may further aggregate to form "nano-domains" when solid forms of the block copolymer are provided. More specifically, the disiloxy units [$R^1_2SiO_{2/2}$] are arranged in linear blocks having an average of from 10 to 400 disiloxy units [$R^1_2SiO_{2/2}$] per linear block, and the trisiloxy units [$R^2SiO_{3/2}$] are arranged in non-linear blocks having a molecular weight of at least 500 g/mol and at least 30% of the non-linear blocks are crosslinked with each other.

The present organosiloxane block copolymers comprising 40 to 90 mole percent disiloxy units of the formula [$R^1_2SiO_{2/2}$] and 10 to 60 mole percent trisiloxy units of the formula [$R^2SiO_{3/2}$] may be represented by the formula [$R^1_2SiO_{2/2}$]$_a$[$R^2SiO_{3/2}$]$_b$ where the subscripts a and b represent the mole fractions of the siloxy units in the copolymer,
    a may vary from 0.4 to 0.9,
        alternatively from 0.5 to 0.9,
            alternatively from 0.6 to 0.9,
    b may vary from 0.1 to 0.6,
        alternatively from 0.1 to 0.5,
            alternatively from 0.1 to 0.4,
    $R^1$ is independently a $C_1$ to $C_{30}$ hydrocarbyl,
    $R^2$ is independently a $C_1$ to $C_{10}$ hydrocarbyl, It should be understood that the present organosiloxane block copolymers may contain additional siloxy units, such as M siloxy units, Q siloxy units, other unique D or T siloxy units (for example having a organic groups other than $R^1$ or $R^2$), providing the organosiloxane block copolymer contains the mole fractions of the disiloxy and trisiloxy units as described above. In other words, the sum of the mole fractions as designated by subscripts a and b, do not necessarily have to sum to one. The sum of a+b may be less than one to account for minor amounts of other siloxy units that may be present in the organosiloxane block copolymer. Alternatively, the sum of a+b is greater than 0.6, alternatively greater than 0.7, alternatively greater than 0.8, or alternatively greater than 0.9.

In one embodiment, the organosiloxane block copolymer consists essentially of the disiloxy units of the formula [$R^1_2SiO_{2/2}$] and trisiloxy units of the formula [$R^2SiO_{3/2}$], while also containing 0.5 to 25 mole percent silanol groups [≡SiOH], where $R^1$ and $R^2$ are as defined above. Thus, in this embodiment, the sum of a+b (when using mole fractions to represent the amount of disiloxy and trisiloxy units in the copolymer) is greater than 0.95, alternatively greater than 0.98.

The resin-linear organosiloxane block copolymers also contain silanol groups (≡SiOH). The amount of silanol groups present on the organosiloxane block copolymer may vary from 0.5 to 35 mole percent silanol groups [≡SiOH].
    alternatively from 2 to 32 mole percent silanol groups [≡SiOH],
        alternatively from 8 to 22 mole percent silanol groups [≡SiOH].

The silanol groups may be present on any siloxy units within the organosiloxane block copolymer. The amount described above represent the total amount of silanol groups found in the organosiloxane block copolymer. However, the present inventors believe the majority of the silanol groups will reside on the trisiloxy units, i.e., the resin component of the block copolymer. Although not wishing to be bound by any theory, the present inventors believe the silanol groups present on the resin component of the organosiloxane block copolymer allows for the block copolymer to further react or cure at elevated temperatures.

The amount of disiloxy and trisiloxy units in the present organosiloxane block copolymers may be described according to the weight percent of each in the block copolymer. This provides a convenient way to characterize the organosiloxane block copolymer for various end use applications.

In one embodiment, the organosiloxane block copolymers contain at least 30 weight percent of disiloxy units, alternatively at least 50 weight percent, alternatively at least 60 weight percent, or alternatively at least 70 weight percent of disiloxy units.

$R^1$ in the above disiloxy unit formula is independently a $C_1$ to $C_{30}$ hydrocarbyl. The hydrocarbon group may independently be an alkyl, aryl, or alkylaryl group. As used herein, hydrocarbyl also includes halogen substituted hydrocarbyls. $R^1$ may be a $C_1$ to $C_{30}$ alkyl group, alternatively $R^1$ may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

Each $R^2$ in the above trisiloxy unit formula is independently a $C_1$ to $C_{20}$ hydrocarbyl. As used herein, hydrocarbyl also includes halogen substituted hydrocarbyls. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The formula [$R^1_2SiO_{2/2}$]$_a$[$R^2SiO_{3/2}$]$_b$, and related formulae using mole fractions, as used herein to describe the present organosiloxane block copolymers, does not indicate structural ordering of the disiloxy [$R^1_2SiO_{2/2}$] and trisiloxy [$R^2SiO_{3/2}$] units in the copolymer. Rather, this formula is meant to provide a convenient notation to describe the relative amounts of the two units in the copolymer, as per the mole fractions described above via the subscripts a and b. The mole fractions of the various siloxy units in the present organosiloxane block copolymers, as well as the silanol content, may be readily determined by $^{29}Si$ NMR techniques, as detailed in the Examples.

The present organosiloxane block copolymers have an average molecular weight ($M_w$) of at least 20,000 g/mole, alternatively an average molecular weight of at least 40,000 g/mole alternatively an average molecular weight of at least 50,000 g/mole, alternatively an average molecular weight of at least 60,000 g/mole, alternatively an average molecular weight of at least 70,000 g/mole, or alternatively an average molecular weight of at least 80,000 g/mole. The average molecular weight may be readily determined using Gel Permeation Chromatography (GPC) techniques, such as those described in the Examples.

The structural ordering of the disiloxy and trisiloxy units may be further described as follows; the disiloxy units $[R^1_2SiO_{2/2}]$ are arranged in linear blocks having an average of from 10 to 400 disiloxy units $[R^1_2SiO_{2/2}]$ per linear block, and the trisiloxy units $[R^2SiO_{3/2}]$ are arranged in non-linear blocks having a molecular weight of at least 500 g/mol. Each linear block is linked to at least one non-linear block in the block copolymer. Furthermore, at least at 30% of the non-linear blocks are crosslinked with each other, alternatively at least at 40% of the non-linear blocks are crosslinked with each other, alternatively at least at 50% of the non-linear blocks are crosslinked with each other.

The crosslinking of the non-linear blocks may be accomplished via a variety of chemical mechanisms and/or moieties. For example, crosslinking of non-linear blocks within the block copolymer may result from the condensation of residual silanol groups present in the non-linear blocks of the copolymer. Crosslinking of the non-linear blocks within the block copolymer may also occur between "free resin" components and the non-linear blocks. "Free resin" components may be present in the block copolymer compositions as a result of using an excess amount of an organosiloxane resin during the preparation of the block copolymer. The free resin component may crosslink with the non-linear blocks by condensation of the residual silanol groups present on the non-blocks and on the free resin. The free resin may provide crosslinking by reacting with lower molecular weight compounds added as crosslinkers, as described below.

Alternatively, certain compounds may have been added during the preparation of the block copolymer to specifically crosslink the non-resin blocks. These crosslinking compounds may include an organosilane having the formula $R^5_qSiX_{4-q}$ is added during the formation of the block copolymer (step II as discussed below), where $R^5$ is a $C_1$ to $C_8$ hydrocarbyl or a $C_1$ to $C_8$ halogen-substituted hydrocarbyl, X is a hydrolysable group, and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be a, an oximo, acetoxy, halogen atom, hydroxyl (OH), or an alkoxy group. In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful as crosslinkers include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketoxime)silane.

The crosslinks within the block copolymer will primarily be siloxane bonds ≡Si—O—Si≡, resulting from the condensation of silanol groups, as discussed above.

The amount of crosslinking in the block copolymer may be estimated by determining the average molecular weight of the block copolymer, such as with GPC techniques. Typically, crosslinking the block copolymer increases its average molecular weight. Thus, an estimation of the extent of crosslinking may be made, given the average molecular weight of the block copolymer, the selection of the linear siloxy component (that is the chain length as indicated by its degree of polymerization), and the molecular weight of the non-linear block (which is primarily controlled by the selection of the selection of the organosiloxane resin used to prepare the block copolymer).

Curable compositions of the organosiloxane block copolymers comprise:

a) the organosiloxane block copolymers as described above, and b) an organic solvent.

The organic solvent typically is an aromatic solvent, such as benzene, toluene, or xylene.

The curable compositions may further contain an organosiloxane resin. The organosiloxane resin present in these compositions typically will be the organosiloxane resin used to prepare the organosiloxane block copolymer. Thus, the organosiloxane resin may comprise at least 60 mol % of $[R^2SiO_{3/2}]$ siloxy units in its formula, where each $R^2$ is independently a $C_1$ to $C_{20}$ hydrocarbyl. Alternatively, the organosiloxane resin is a silsesquioxane resin, or alternatively a phenyl silsesquioxane resin.

The amount of the organosiloxane block copolymers, organic solvent, and optional organosiloxane resin in the present curable composition may vary. The curable composition may contain;

40 to 80 weight % of the organosiloxane block copolymer as described above, 10 to 80 weight % of the organic solvent, and 5 to 40 weight % of the organosiloxane resin, providing the sum of the weight % of these components does not exceed 100%. In one embodiment, the curable compositions consist essentially of the organosiloxane block copolymer as described above, the organic solvent, and the organosiloxane resin. In this embodiment, the weight % of these components sum to 100%, or nearly 100%.

The curable compositions contain a cure catalyst. The cure catalyst may be selected from any catalyst known in the art to affect condensation cure of organosiloxanes, such as various tin or titanium catalysts. Condensation catalyst can be any condensation catalyst typically used to promote condensation of silicon bonded hydroxy (≡silanol) groups to form Si—O—Si linkages. Examples include, but are not limited to, amines, complexes of lead, tin, titanium, zinc, and iron.

The organosiloxane block copolymers and curable compositions containing the organosiloxane block copolymer may be prepared by the methods as described further below in this disclosure. Representative examples of their preparation are also detailed in the Examples section below.

Solid compositions containing the resin-linear organosiloxane block copolymers may be prepared by removing the solvent from the curable organosiloxane block copolymer compositions as described above. The solvent may be removed by any known processing techniques. In one embodiment, a film of the curable compositions containing the organosiloxane block copolymers is formed, and the solvent is allowed to evaporate from the film. Subjecting the films to elevated temperatures, and/or reduced pressures, will accelerate solvent removal and subsequent formation of the solid curable composition. Alternatively, the curable compositions may be passed through an extruder to remove solvent and provide the solid composition in the form of a ribbon or pellets. Coating operations against a release film could also be used as in slot die coating, knife over roll, rod, or gravure coating. Also, roll-to-roll coating operations could be used to prepare a solid film. In coating operations, a conveyer oven or other means of heating and evacuating the solution can be used to drive off the solvent and obtain the final solid film.

Although not wishing to be bound by any theory, the inventors believe the structural ordering of the disiloxy and trisiloxy units in the organosiloxane block copolymer as described above may provide the copolymer with certain unique physical property characteristics when solid compositions of the block copolymer are formed. For example, the structural ordering of the disiloxy and trisiloxy units in the copolymer may provide solid coatings that allow for a high optical transmittance of visible light. The structural ordering may also allow the organosiloxane block copolymer to flow and cure upon heating, yet remain stable at room temperature. They may also be processed using lamination techniques. These properties are useful to provide coatings for various electronic articles to improve weather resistance and durability, while providing low cost and easy procedures that are energy efficient.

The present disclosure relates to solid forms of the aforementioned organosiloxane block copolymers and solid compositions derived from the curable compositions described above comprising the organosiloxane block copolymers. Thus, the present disclosure provides organosiloxane block copolymers comprising:

40 to 90 mole percent disiloxy units of the formula $[R^1{}_2SiO_{2/2}]$ 10 to 60 mole percent trisiloxy units of the formula $[R^2SiO_{3/2}]$ 0.5 to 25 mole percent silanol groups [≡SiOH]

where $R^1$ is independently a $C_1$ to $C_{30}$ hydrocarbyl, $R^2$ is independently a $C_1$ to $C_{20}$ hydrocarbyl, wherein;

the disiloxy units $[R^1{}_2SiO_{2/2}]$ are arranged in linear blocks having an average of from 10 to 400 disiloxy units $[R^1{}_2SiO_{2/2}]$ per linear block, the trisiloxy units $[R^2SiO_{3/2}]$ are arranged in non-linear blocks having a molecular weight of at least 500 g/mol, at least 30% of the non-linear blocks are crosslinked with each other and are predominately aggregated together in nano-domains, each linear block is linked to at least one non-linear block, the organosiloxane block copolymer has a molecular weight of at least 20,000 g/mole, is a solid at 25° C., and the solid composition has a tensile strength greater than 1.0 MPa and an % elongation at break greater than 40%.

The aforementioned organosiloxane block copolymers are isolated in a solid form, for example by casting films of a solution of the block copolymer in an organic solvent and allowing the solvent to evaporate. Upon drying or forming a solid, the non-linear blocks of the block copolymer further aggregate together to form "nano-domains". As used herein, "predominately aggregated" means the majority of the non-linear blocks of the organosiloxane block copolymer are found in certain regions of the solid composition, described herein as "nano-domains". As used herein, "nano-domains" refers to those phase regions within the solid block copolymer compositions that are phase separated within the solid block copolymer compositions and possess at least one dimension sized from 1 to 100 nanometers. The nano-domains may vary in shape, providing at least one dimension of the nano-domain is sized from 1 to 100 nanometers. Thus, the nano-domains may be regular or irregularly shaped. The nano-domains may be spherically shaped, tubular shaped, and in some instances lamellar shaped.

In a further embodiment, the solid organosiloxane block copolymers as described above contain a first phase and an incompatible second phase, the first phase containing predominately the disiloxy units $[R^1{}_2SiO_{2/2}]$ as defined above, the second phase containing predominately the trisiloxy units $[R^2SiO_{3/2}]$ as defined above, the non-linear blocks being sufficiently aggregated into nano-domains which are incompatible with the first phase.

When solid compositions are formed from the curable compositions of the organosiloxane block copolymer which also contain an organosiloxane resin, as described above, the organosiloxane resin also predominately aggregates within the nano-domains.

The structural ordering of the disiloxy and trisiloxy units in the solid block copolymers of the present disclosure, and characterization of the nano-domains, may be determined explicitly using certain analytical techniques such as Transmission Electron Microscopic (TEM) techniques, Atomic Force Microscopy (AFM), Small Angle Neutron Scattering, Small Angle X-Ray Scattering, and Scanning Electron Microscopy. An AFM image of a solid coating containing a representative organosiloxane block copolymer is shown in FIG. 1. This image was obtained using a tapping mode showing the phase angle. The lighter areas correspond to the nano-domains containing the non-linear blocks, whereas the darker areas correspond to the linear block rich phase.

Alternatively, the structural ordering of the disiloxy and trisiloxy units in the block copolymer, and formation of nano-domains, may be implied by characterizing certain physical properties of coatings resulting from the present organosiloxane block copolymers. For example, the present organosiloxane copolymers may provide coatings that have an optical transmittance of visible light greater than 95%. One skilled in the art recognizes that such optical clarity is possible (other than refractive index matching of the two phases) only when visible light is able to pass through such a medium and not be diffracted by particles (or domains as used herein) having a size greater than 150 nanometers. As the particle size, or domains further decreases, the optical clarity may be further improved. Thus, coatings derived from the present organosiloxane copolymers may have an optical transmittance of visible light at least 95%.

In some aspects, the present resin-linear organosiloxane block copolymers may conceptually be compared to organic thermoplastics elastomers (TPEs). TPEs possess phase segregated "soft" and "hard" polymeric blocks. The solid compositions containing the present resin-linear organopolysiloxanes block copolymers may be viewed as containing phase separated "soft" and "hard" segments resulting from the block of linear D units and aggregates of blocks of non-linear T units respectively. These respective soft and hard segments may be characterized by their differing glass transition temperatures ($T_g$). Thus the linear segments of the resin-linear organosiloxanes may be consider a "soft" segment by typically having a low $T_g$, for example less than 25° C., alternatively less than 0° C., or alternatively even less than –20° C. Thus, the linear segments will attempt to maintain their "fluid" like behavior in resulting compositions of the organosiloxane block copolymer. Conversely, the non-linear blocks within the organosiloxane copolymer may be likened to "hard segments" by typically having higher $T_g$ values, for example greater than 30° C., alternatively greater than 40° C., or alternatively even greater than 50° C.

The advantage of the present resin-linear organopolysiloxanes block copolymers is that they can be processed several times providing the processing temperature ($T_{processing}$) is less than the temperature required to finally cure ($T_{cure}$) the organosiloxane block copolymer, i.e. if $T_{processing} < T_{cure}$. However the organosiloxane copolymer will cure and achieve high temperature stability when $T_{processing} > T_{cure}$. Thus, the present resin-linear organopolysiloxanes block copolymers offer the significant advantage of being "re-processable" in conjunction with the benefits typically associated with silicones, such as; hydrophobicity, high temperature stability, moisture/UV resistance.

Figure 2:
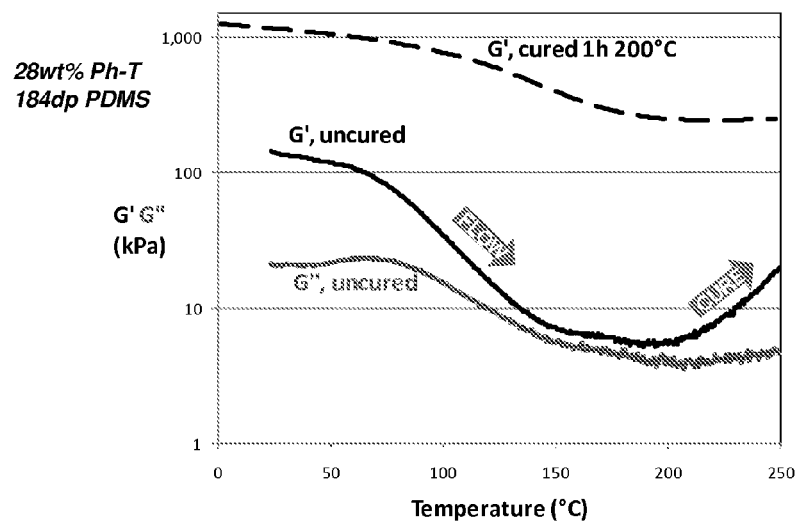
FIG. 2—A rheology curve of a representative resin-linear organosiloxane block copolymer demonstrating "reprocessabililty" behavior.

In one embodiment, the solid compositions of the organosiloxane block copolymers may be considered as "melt processable". In this embodiment, the solid compositions, such as a coating formed from a film of a solution containing the organosiloxane block copolymers, exhibit fluid behavior at elevated temperatures, that is upon "melting". The "melt processable" features of the solid compositions of the organosiloxane block copolymers may be monitored by measuring the "melt flow temperature" of the solid compositions, that is when the solid composition demonstrates liquid behavior. The melt flow temperature may specifically be determined by measuring the storage modulus (G'), loss modulus (G") and tan delta as a function of temperature storage using commercially available instruments. For example, a commercial rheometer (such as TA Instruments' ARES-RDA—with 2 KSTD standard flexular pivot spring transducer, with forced convection oven) may be used to measure the storage modulus (G'), loss modulus (G") and tan delta as a function of temperature. Test specimens (typically 8 mm wide, 1 mm thick) may be loaded in between parallel plates and measured using small strain oscillatory rheology while ramping the temperature in a range from 25° C. to 300° C. at 2° C./min (frequency 1 Hz). A typical rheology curve on an organosiloxane copolymer is shown in FIG. 2. The flow onset may be calculated as the inflection temperature in the G' drop (labeled FLOW), the viscosity at 120° C. is reported as a measure for melt processability and the cure onset is calculated as the onset temperature in the G' rise (labeled CURE). Typically, the FLOW of the solid compositions will also correlate to the glass transition temperature of the non-linear segments (i.e. the resin component) in the organosiloxane block copolymer.

In a further embodiment, the solid compositions may be characterized as having a melt flow temperature ranging from 25° C. to 200° C., alternatively from 25° C. to 160° C., or alternatively from 50° C. to 160° C.

The present inventors believe the melt processability benefits enables the reflow of solid compositions of the organosiloxane block copolymers around device architectures, after an initial coating or solid is formed on the device. This feature is very beneficial to encapsulated various electronic devices.

In one embodiment, the solid compositions of the organosiloxane block copolymers may be considered as "curable". In this embodiment, the solid compositions, such as a coating formed from a film of a solution containing the organosiloxane block copolymers, may undergo further physical property changes by further curing the block copolymer. As discussed above, the present organosiloxane block copolymers contain a certain amount of silanol groups. The inventors believe the presence of these silanol groups on the block copolymer permit further reactivity, i.e. a cure mechanism. Upon curing, the physical properties of solid compositions may be further altered, as discussed in certain embodiments below.

Alternatively, the "melt processability" and/or cure of the solid compositions of the organosiloxane block copolymers may be determined by rheological measurements at various temperatures.

The solid compositions containing the organosiloxane block copolymers may have a storage modulus (G') at 25° C. ranging from 0.01 MPa to 500 MPa and a loss modulus (G") ranging from 0.001 MPa to 250 MPa, alternatively a storage modulus (G') at 25° C. ranging from 0.1 MPa to 250 MPa and a loss modulus (G") ranging from 0.01 MPa to 125 MPa, alternatively a storage modulus (G') at 25° C. ranging from 0.1 MPa to 200 MPa and a loss modulus (G") ranging from 0.01 MPa to 100 MPa.

The solid compositions containing the organosiloxane block copolymers may have a storage modulus (G') at 120° C. ranging from 10 Pa to 500,000 Pa and a loss modulus (G") ranging from 10 Pa to 500,000 Pa, alternatively a storage modulus (G') at 120° C. ranging from 20 Pa to 250,000 Pa and a loss modulus (G") ranging from 20 Pa to 250,000 Pa, alternatively a storage modulus (G') at 120° C. ranging from 30 Pa to 200,000 Pa and a loss modulus (G") ranging from 30 Pa to 200,000 Pa.

The solid compositions containing the organosiloxane block copolymers may have a storage modulus (G') at 200° C. ranging from 10 Pa to 100,000 Pa and a loss modulus (G") ranging from 5 Pa to 80,000 Pa, alternatively a storage modulus (G') at 200° C. ranging from 20 Pa to 75,000 Pa and a loss modulus (G") ranging from 10 Pa to 65,000 Pa, alternatively a storage modulus (G') at 200° C. ranging from 30 Pa to 50,000 Pa and a loss modulus (G") ranging from 15 Pa to 40,000 Pa.

The solid compositions may be further characterized by certain physical properties such as tensile strength and % elongation at break. The present solid compositions derived from the aforementioned organosiloxane block copolymers may have an initial tensile strength greater than 1.0 MPa, alternatively greater than 1.5 MPa, or alternatively greater than 2 MPa. The present solid compositions derived from the aforementioned organosiloxane block copolymers may have an initial % elongation at break (or rupture) greater than 40%, alternatively greater than 50%, or alternatively greater than 75%. As used herein, tensile strength and % elongation at break are measured according to ASTM D412.

The solid compositions may be further characterized by their ability to retain certain physical properties such as tensile strength and % elongation at break, upon heat aging of the solid compositions. Thus, in a further embodiment, the tensile strength of the aforementioned solid compositions remains within 20%, alternatively within 10%, or alternatively within 5% of its original value upon heat aging the composition at 200° C. for 1000 hours. The % elongation at break of the aforementioned solid compositions is at least 10%, alternatively 50%, or alternatively 75% upon heat aging the composition at 200° C. for 1000 hours.

In one embodiment, the solid compositions of the organosiloxane block copolymers contain at least 30 weight percent of disiloxy units, alternatively at least 50 weight percent, alternatively at least 60 weight percent, or alternatively at least 70 weight percent of disiloxy units. In a further embodiment, the disiloxy units have the formula $[(CH_3)_2SiO_{2/2}]$. In a further embodiment, the disiloxy units have the formula $[(CH_3)(C_6H_5)SiO_{2/2}]$.

The solid compositions of the present disclosure may be characterized by their refractive index (RI). The RI of the solid compositions as disclosed herein are based on ASTM D542. The RI of the present solid compositions have a value of at least 1.5, or alternatively of 1.55, as determined by ASTM D542.

The aforementioned resin-linear organosiloxane block copolymers may be prepared by a process comprising:

I) reacting
a) a linear organosiloxane having the formula

where each $R^1$ is independently a $C_1$ to $C_{30}$ hydrocarbyl,
n is 10 to 400, q is 0, 1, or 2,
E is a hydrolyzable group containing at least one carbon atom, and
b) an organosiloxane resin comprising at least 60 mol % of $[R^2SiO_{3/2}]$ siloxy units in its formula, where each $R^2$ is independently a $C_1$ to $C_{20}$ hydrocarbyl,
in c) an organic solvent
to form a resin-linear organosiloxane block copolymer;
wherein the amounts of a) and b) used in step I are selected to provide the resin-linear organosiloxane block copolymer with 40 to 90 mol % of disiloxy units $[R^1{}_2SiO_{2/2}]$ and 10 to 60 mol % of trisiloxy units $[R^2SiO_{3/2}]$, and
wherein at least 95 weight percent of the linear organosiloxane added in step I is incorporated into the resin-linear organosiloxane block copolymer,
II) reacting the resin-linear organosiloxane block copolymer from step I) to crosslink the trisiloxy units of the resin-linear organosiloxane block copolymer sufficiently to increase the average molecular weight ($M_w$) of the resin-linear organosiloxane block copolymer by at least 50%,
III) optionally, further processing the resin-linear organosiloxane block copolymer to enhance storage stability and/or optical clarity,
IV) optionally, removing the organic solvent.
The first step in the present process involves reacting;
a) a linear organosiloxane having the formula

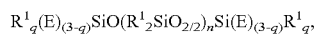

where each $R^1$ is independently a $C_1$ to $C_{30}$ hydrocarbyl,
n is 10 to 400, q is 0, 1, or 2,
E is a hydrolyzable group containing at least one carbon atom, and
b) an organosiloxane resin comprising at least 60 mol % of $[R^2SiO_{3/2}]$ siloxy units in its formula, where each $R^2$ is independently an aryl or $C_1$ to $C_{10}$ hydrocarbyl,
in c) an organic solvent
to form a resin-linear organosiloxane block copolymer;
wherein the amounts of a) and b) used in step I are selected to provide the resin-linear organosiloxane block copolymer with 40 to 90 mol % of disiloxy units $[R^1{}_2SiO_{2/2}]$ and 10 to 60 mol % of trisiloxy units $[R^2SiO_{3/2}]$, and
wherein at least 95 weight percent of the linear organosiloxane added in step I is incorporated into the resin-linear organosiloxane block copolymer.
The reaction of the first step of the process may be represented generally according to the following schematic;

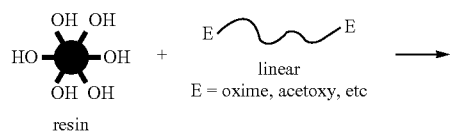

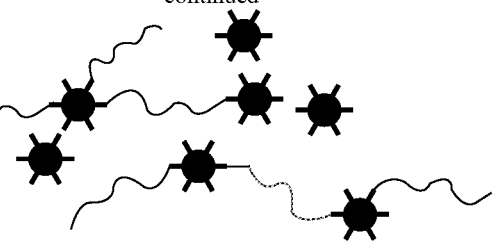

The various OH groups on the organosiloxane resin are reacted with the hydrolyzable groups (E) on the linear organosiloxane, to form a resin-linear organosiloxane block copolymer and a H-(E) compound. The reaction in step I may be considered as a condensation reaction between the organosiloxane resin and the linear organosiloxane.

The Linear Organosiloxane

Component a) in step I of the present process is a linear organosiloxane having the formula $R^1{}_q(E)_{(3-q)}SiO(R^1{}_2SiO_{2/2})_nSi(E)_{(3-q)}R^1{}_q$, where each $R^1$ is independently a $C_1$ to $C_{30}$ hydrocarbyl, the subscript "n" may be considered as the degree of polymerization (dp) of the linear organosiloxane and may vary from 10 to 400, the subscript "q" may be 0, 1, or 2, and E is a hydrolyzable group containing at least one carbon atom. While component a) is described as a linear organosiloxane having the formula $R^1{}_q(E)_{(3-q)}SiO(R^1{}_2SiO_{2/2})_nSi(E)_{3-q})R^1{}_q$, one skilled in the art recognizes small amount of alternative siloxy units, such a T ($R^1SiO_{3/2}$) siloxy units, may be incorporated into the linear organosiloxane and still be used as component a). As such the organosiloxane may be considered as being "predominately" linear by having a majority of D ($R^1{}_2SiO_{2/2}$) siloxy units. Furthermore, the linear organosiloxane used as component a) may be a combination of several linear organosiloxanes.

$R^1$ in the above linear organosiloxane formula is independently a $C_1$ to $C_{30}$ hydrocarbyl. The hydrocarbon group may independently be an alkyl, aryl, or alkylaryl group. $R^1$ may be a $C_1$ to $C_{30}$ alkyl group, alternatively may be a $C_1$ to $C_{18}$ alkyl group. Alternatively $R^1$ may be a $C_1$ to $C_6$ alkyl group such as methyl, ethyl, propyl, butyl, pentyl, or hexyl. Alternatively $R^1$ may be methyl. $R^1$ may be an aryl group, such as phenyl, naphthyl, or an anthryl group. Alternatively, $R^1$ may be any combination of the aforementioned alkyl or aryl groups. Alternatively, $R^1$ is phenyl, methyl, or a combination of both.

E may be selected from any hydrolyzable group containing at least one carbon atom, but typically E is selected from an oximo, epoxy, carboxy, amino, or amido group. Alternatively, E may have the formula $R^1C(=O)O-$, $R^1{}_2C=N-O-$, or $R^4C=N-O-$ where $R^1$ is as defined above, and $R^4$ is hydrocarbylene. In one embodiment, E is $H_3CC(=O)O-$ (acetoxy) and q is 1. In one embodiment, E is $(CH_3)(CH_3CH_2)C=N-O-$ (methylethylketoxy) and q is 1.

In one embodiment, the linear organosiloxane has the formula $(CH_3)_q(E)_{(3-q)}SiO[(CH_3)_2SiO_{2/2})]_nSi(E)_{(3-q)}(CH_3)_q$, where E, n, and q are as defined above.

In one embodiment, the linear organosiloxane has the formula $(CH_3)_q(E)_{(3-q)}SiO[(CH_3)(C_6H_5)SiO_{2/2})]_nSi(E)_{(3-q)}(CH_3)_q$, where E, n, and q are as defined above.

Processes for preparing linear organosiloxanes suitable as component a) are known. Typically a silanol ended polydiorganosiloxane is reacted with an "endblocking" compound such as an alkyltriacetoxysilane or a dialkylketoxime. The stoichiometry of the endblocking reaction is typically adjusted such that a sufficient amount of the endblocking compound is added to react with all the silanol groups on the polydiorganosiloxane. Typically, a mole of the endblocking compound is used per mole of silanol on the polydiorganosiloxane. Alternatively, a slight molar excess such as 1 to 10% of the endblocking compound may be used. The reaction is typically conducted under anhydrous conditions to minimize condensation reactions of the silanol polydiorganosiloxane. Typically, the silanol ended polydiorganosiloxane and the endblocking compound are dissolved in an organic solvent under anhydrous conditions, and allowed to react at room temperature, or at elevated temperatures (up to the boiling point of the solvent).

The Organosiloxane Resin

Component b) in the present process is an organosiloxane resin comprising at least 60 mol % of $[R^2SiO_{3/2}]$ siloxy units in its formula, where each $R^2$ is independently a $C_1$ to $C_{20}$ hydrocarbyl. The organosiloxane resin may contain any amount and combination of other M, D, and Q siloxy units, providing the organosiloxane resin contains at least 70 mol % of $[R^2SiO_{3/2}]$ siloxy units, alternatively the organosiloxane resin contains at least 80 mol % of $[R^2SiO_{3/2}]$ siloxy units, alternatively the organosiloxane resin contains at least 90 mol % of $[R^2SiO_{3/2}]$ siloxy units, or alternatively the organosiloxane resin contains at least 95 mol % of $[R^2SiO_{3/2}]$ siloxy units. Organosiloxane resins useful as component b) include those known as "silsesquioxane" resins.

Each $R^2$ is independently a $C_1$ to $C_{20}$ hydrocarbyl. $R^2$ may be an aryl group, such as phenyl, naphthyl, anthryl group. Alternatively, $R^2$ may be an alkyl group, such as methyl, ethyl, propyl, or butyl. Alternatively, $R^2$ may be any combination of the aforementioned alkyl or aryl groups. Alternatively, $R^2$ is phenyl or methyl.

The molecular weight ($M_w$) of the organosiloxane resin is not limiting, but typically ranges from 1000 to 10,000, or alternatively 1500 to 5000 g/mol.

One skilled in the art recognizes that organosiloxane resins containing such high amounts of $[R^2SiO_{3/2}]$ siloxy units will inherently have a certain concentration of Si—OZ where Z may be hydrogen (i.e. silanol), an alkyl group (so that OZ is an alkoxy group), or alternatively OZ may also be any of the "E" hydrolyzable groups as described above. The Si—OZ content as a mole percentage of all siloxy groups present on the organosiloxane resin may be readily determined by $^{29}$Si NMR. The concentration of the OZ groups present on the organosiloxane resin will vary, as dependent on the mode of preparation, and subsequent treatment of the resin. Typically, the silanol (Si—OH) content of organosiloxane resins suitable for use in the present process will have a silanol content of at least 5 mole %, alternatively of at least 10 mole %, alternatively 25 mole %, alternatively 40 mole %, or alternatively 50 mole %.

Organosiloxane resins containing at least 60 mol % of $[R^2SiO_{3/2}]$ siloxy units, and methods for preparing them, are known in the art. They are typically prepared by hydrolyzing an organosilane having three hydrolyzable groups on the silicon atom, such as a halogen or alkoxy group in an organic solvent. A representative example for the preparation of a silsesquioxane resin may be found in U.S. Pat. No. 5,075,103. Furthermore, many organosiloxane resins are available commercially and sold either as a solid (flake or powder), or dissolved in an organic solvent. Suitable, non-limiting, commercially available organosiloxane resins useful as component b) include; Dow Corning® 217 Flake Resin, 233 Flake, 220 Flake, 249 Flake, 255 Flake, Z-6018 Flake (Dow Corning Corporation, Midland Mich.).

One skilled in the art further recognizes that organosiloxane resins containing such high amounts of $[R^2SiO_{3/2}]$ siloxy units and silanol contents may also retain water molecules, especially in high humidity conditions. Thus, it is often beneficial to remove excess water present on the resin by "drying" the organosiloxane resin prior to reacting in step I. This may be achieved by dissolving the organosiloxane resin in an organic solvent, heating to reflux, and removing water by separation techniques (for example Dean Stark trap or equivalent process).

The amounts of a) and b) used in the reaction of step I are selected to provide the resin-linear organosiloxane block copolymer with 40 to 90 mol % of disiloxy units $[R^1_2SiO_{2/2}]$ and 10 to 60 mol % of trisiloxy units $[R^2SiO_{3/2}]$. The mol % of disiloxy and trisiloxy units present in components a) and b) may be readily determined using $^{29}$Si NMR techniques. The starting mol % then determines the mass amounts of components a) and b) used in step I.

The amount of components a) and b) selected should also ensure there is a molar excess of the silanol groups on the organosiloxane resin vs amount of linear organosiloxane added. Thus, a sufficient amount of the organosiloxane resin should be added to potentially react with all the linear organosiloxane added in step I). As such, a molar excess of the organosiloxane resin is used. The amounts used may be determined by accounting for the moles of the organosiloxane resin used per mole of the linear organosiloxane. To illustrate a typical calculation, the amounts of components a) and b) as used in Example 3 below are detailed. In example 3, 28 wt % Dow Corning® 217 flake resin with number average molecular weight of about 1,200 g/mol (Mn) was used and 72 wt % silanol terminated PDMS (Gelest DMS-S27) was used with Mn around 13,500 g/mol. When Dow Corning® 217 flake is used in a copolymer, a ratio of 4.38 resin molecules to PDMS molecules [(28/1200)/(72/13500)] is obtained and as such provides an excess of resin molecules to react all PDMS molecules into the copolymer.

As discussed above, the reaction affected in step I is a condensation reaction between the hydrolyzable groups of linear organosiloxane with the silanol groups on the organosiloxane resin. A sufficient amount of silanol groups needs to remain on the resin component of the formed resin-linear organosiloxane copolymer to further react in step II of the present process. Typically, at least 10 mole %, alternatively at least 20 mole %, or alternatively at least 30 mole % silanol should remain on the trisiloxy units of the resin-linear organosiloxane copolymer as produced in step I of the present process.

The reaction conditions for reacting the aforementioned (a) linear organosiloxane with the (b) organosiloxane resin are not particularly limited. Typically, reaction conditions are selected to affect a condensation type reaction between the a) linear organosiloxane and b) organosiloxane resin. Various non-limiting embodiments and reaction conditions are described in the Examples below. In some embodiments, the (a) linear organosiloxane and the (b) organosiloxane resin are reacted at room temperature. In other embodiments, (a) and (b) are reacted at temperatures that exceed room temperature and that range up to about 50, 75, 100, or even up to 150° C. Alternatively, (a) and (b) can be reacted together at reflux of the solvent. In still other embodiments, (a) and (b) are reacted at temperatures that are below room temperature by 5, 10, or even more than 10° C. In still other embodiments (a) and (b) react for times of 1, 5, 10, 30, 60, 120, or 180 minutes, or even longer. Typically, (a) and (b) are reacted under an inert atmosphere, such as nitrogen or a noble gas. Alternatively, (a) and (b) may be reacted under an atmosphere that includes some water vapor and/or oxygen. Moreover, (a) and (b) may be reacted in any size vessel and using any equipment including mixers, vortexers, stirrers, heaters, etc. In other embodiments, (a) and (b) are reacted in one or more organic solvents which may be polar or non-polar. Typically, aromatic solvents such as toluene, xylene, benzene, and the like are utilized. The amount of the organosiloxane resin dissolved in the organic solvent may vary, but typically the amount should be selected to minimize the chain extension of the linear organosiloxane or pre-mature condensation of the organosiloxane resin.

The order of addition of components a) and b) may vary, but typically the linear organosiloxane is added to a solution of the organosiloxane resin dissolved in the organic solvent. This order of addition is believed to enhance the condensation of the hydrolyzable groups on the linear organosiloxane with the silanol groups on organosiloxane resin, while minimizing chain extension of the linear organosiloxane or pre-mature condensation of the organosiloxane resin.

The progress of the reaction in step I, and the formation of the resin-linear organosiloxane block copolymer, may be monitored by various analytical techniques, such as GPC, IR, or $^{29}$Si NMR. Typically, the reaction in step I is allowed to continue until at least 95 weight percent of the linear organosiloxane added in step I is incorporated into the resin-linear organosiloxane block copolymer.

The second step of the present process involves further reacting the resin-linear organosiloxane block copolymer from step I) to crosslink the trisiloxy units of the resin-linear organosiloxane block copolymer to increase the molecular weight of the resin-linear organosiloxane block copolymer by at least 50%, alternatively by at least 60%, alternatively by 70%, alternatively by at least 80%, alternatively by at least 90%, or alternatively by at least 100%.

The reaction of the second step of the process may be represented generally according to the following schematic;

Crosslinking of the non-linear blocks within the block copolymer may also occur between "free resin" components and the non-linear blocks. "Free resin" components may be present in the block copolymer compositions as a result of using an excess amount of an organosiloxane resin in step I of the preparation of the block copolymer. The free resin component may crosslink with the non-linear blocks by condensation of the residual silanol groups present on the non-linear blocks and on the free resin. The free resin may provide crosslinking by reacting with lower molecular weight compounds added as crosslinkers, as described below.

Step II of the present process may occur simultaneous upon formation of the resin-linear organosiloxane of step I, or involve a separate reaction in which conditions have been modified to affect the step II reaction. The step II reaction may occur in the same conditions as step I. In this situation, the step II reaction proceeds as the resin-linear organosiloxane copolymer is formed. Alternatively, the reaction conditions used for step I) are extended to further the step II reaction. Alternatively, the reaction conditions may be changed, or additional ingredients added to affect the step II reaction.

The present inventors have discovered that the step II reaction conditions may depend on the selection of the hydrolyzable group (E) used in the starting linear organosiloxane. When (E) in the linear organosiloxane is an oxime group, it is possible for the step II reaction to occur under the same reaction conditions as step I. That is, as the linear-resin organosiloxane copolymer is formed in step I, it will continue to react via condensation of the silanol groups present on the resin component to further increase the molecular weight of the resin-linear organosiloxane copolymer. Not wishing to be bound by any theory, the present inventors believe that when

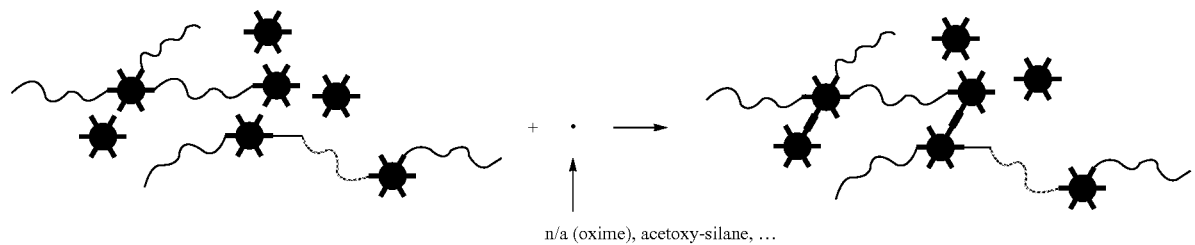

n/a (oxime), acetoxy-silane, . . .

The inventors believe the reaction of step II crosslinks the trisiloxy blocks of the resin-linear organosiloxane block copolymer formed in step I, which will increase the average molecular weight of the block copolymer. The inventors also believe the crosslinking of the trisiloxy blocks provides the block copolymer with an aggregated concentration of trisiloxy blocks, which ultimately may help to form "nano-domains" in solid compositions of the block copolymer. In other words, this aggregated concentration of trisiloxy blocks may phase separate when the block copolymer is isolated in a solid form such as a film or cured coating. The aggregated concentration of trisiloxy block within the block copolymer and subsequent formation of "nano-domains" in the solid compositions containing the block copolymer, may provide for enhanced optical clarity of these compositions as well as the other physical property benefits associated with these materials.

The crosslinking reaction in Step II may be accomplished via a variety of chemical mechanisms and/or moieties. For example, crosslinking of non-linear blocks within the block copolymer may result from the condensation of residual silanol groups present in the non-linear blocks of the copolymer.

(E) is an oximo group, the hydrolyzed oximo group (for example methyl ethylketoxime) resulting from the reaction in step I may act as a condensation catalyst for the step II reaction. As such, the step II reaction may proceed simultaneously under the same conditions for step I. In other words, as the resin-linear organosiloxane copolymer is formed in step I, it may further react under the same reaction conditions to further increase its molecular weight via a condensation reaction of the silanol groups present on the resin component of the copolymer. However, when (E) on the linear organosiloxane is an acetoxy group, the resulting hydrolyzed group (acetic acid), does not sufficiently catalyze the step II) reaction. Thus, in this situation the step II reaction may be enhanced with a further component to affect condensation of the resin components of the resin-linear organosiloxane copolymer, as described in the embodiment below.

In one embodiment of the present process, an organosilane having the formula $R^5{}_q SiX_{4-q}$ is added during step II), where $R^5$ is a $C_1$ to $C_8$ hydrocarbyl or a $C_1$ to $C_8$ halogen-substituted hydrocarbyl, X is a hydrolysable group, and q is 0, 1, or 2. $R^5$ is a $C_1$ to $C_8$ hydrocarbyl or a $C_1$ to $C_8$ halogen-substituted hydrocarbyl, or alternatively $R^5$ is a $C_1$ to $C_8$ alkyl group, or alternatively a phenyl group, or alternatively $R^5$ is methyl, ethyl, or a combination of methyl and ethyl. X is any hydrolyzable group, alternatively X may be E, as defined above, a halogen atom, hydroxyl (OH), or an alkoxy group. In one embodiment, the organosilane is an alkyltriacetoxysilane, such as methyltriacetoxysilane, ethyltriacetoxysilane, or a combination of both. Commercially available representative alkyltriacetoxysilanes include ETS-900 (Dow Corning Corp., Midland, Mich.). Other suitable, non-limiting organosilanes useful in this embodiment include; methyl-tris(methylethylketoxime)silane (MTO), methyl triacetoxysilane, ethyl triacetoxysilane, tetraacetoxysilane, tetraoximesilane, dimethyl diacetoxysilane, dimethyl dioximesilane, methyl tris(methylmethylketoxime)silane.

The amount of organosilane having the formula $R^5_q SiX_{4-q}$ when added during step II) varies, but should be based on the amount of organosiloxane resin used in the process. The amount of silane used should provide a molar stoichiometry of 2 to 15 mol % of organosilane/mols of Si on the organosiloxane resin. Furthermore, the amount of the organosilane having the formula $R^5_q SiX_{4-q}$ added during step II) is controlled to ensure a stoichiometry that does not consume all the silanol groups on the organosiloxane block copolymer. In one embodiment, the amount of the organosilane added in step II is selected to provide an organosiloxane block copolymer containing 0.5 to 35 mole percent of silanol groups [≡SiOH].

Step III in the present process is optional, and involves further processing the resin-linear organosiloxane block copolymer to enhance storage stability and/or optical clarity. As used herein the phrase "further processing" refers to any further reaction or treatment of the formed resin-linear organosiloxane copolymer to enhance its storage stability, and/or optical clarity. The resin-linear organosiloxane copolymer as produced in step II may still contain a significant amount of reactive "OZ" groups (that is ≡SiOZ groups, where Z is as defined above), and/or X groups (where X is introduced into the block copolymer when the organosilane having the formula $R^5_q SiX_{4-q}$ is used in step II). The OZ groups present on the resin-linear organosiloxane copolymer at this stage may be silanol groups that were originally present on the resin component, or alternatively may result from the reaction of the organosilane having the formula $R^5_q SiX_{4-q}$ with silanol groups, when the organosilane is used in step II. The present inventors believe such "OZ" or X groups may further react during storage, limiting shelf stability, or diminishing reactivity of the resin-linear organosiloxane copolymer during end-use applications. Alternatively, further reaction of residual silanol groups may further enhance the formation of the resin domains and improve the optical clarity of the resin-linear organosiloxane copolymer. Thus, optional step III may be performed to further react OZ or X present on the organosiloxane block copolymer produced in Step II to improve storage stability and/or optical clarity. The conditions for step III may vary, depending on the selection of the linear and resin components, their amounts, and the endcapping compounds used. Certain embodiments are described below.

In one embodiment of the process, step III is performed by reacting the resin-linear organosiloxane from step II with water and removing any small molecular compounds formed in the process such as acetic acid. In this embodiment, the resin-linear organosiloxane copolymer is typically produced from a linear organosiloxane where E is an acetoxy group, and/or an acetoxy silane is used in step II. Although not wishing to be bound by any theory, the present inventors believe in this embodiment, the resin-linear organosiloxane formed in step II contains a significant quantity of hydrolyzable Si—O—C(O)CH$_3$ groups, which may limit the storage stability of the resin-linear organosiloxane copolymer. Thus, water may be added to the resin-linear organosiloxane copolymer formed from step II, which will hydrolyze most Si—O—C(O)CH$_3$ groups to further link the trisiloxy units, and eliminate acetic acid. The formed acetic acid, and any excess water, may be removed by known separation techniques. The amount of water added in this embodiment may vary, but typically 10 weight %, or alternatively 5 weight % is added per total solids (as based on resin-linear organosiloxane copolymer in the reaction medium).

In one embodiment of the process, step III is performed by reacting the resin-linear organosiloxane from step II with an endcapping compound selected from an alcohol, oxime, or trialkylsiloxy compound. In this embodiment, the resin-linear organosiloxane copolymer is typically produced from a linear organosiloxane where E is an oxime group. The endcapping compound may be a $C_1$-$C_{20}$ alcohol such as methanol, ethanol, propanol, butanol, or others in the series. Alternatively, the alcohol is n-butanol. The endcapping compound may also be a trialkylsiloxy compound, such as trimethylmethoxysilane or trimethylethoxysilane. The amount of endcapping compound may vary but typically is between 3 and 15 wt % with respect to the resin linear organosiloxane block copolymer solids in the reaction medium.

Step IV of the present process is optional, and involves removing the organic solvent used in the reactions of steps I and II. The organic solvent may be removed by any known techniques, but typically involves heating the resin-linear organosiloxane copolymer compositions at elevated temperature, either at atmospheric conditions or under reduced pressures.

EXAMPLES

The following examples are included to demonstrate preferred embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. %. All measurements were conducted at 23° C. unless indicated otherwise.

Characterization Techniques
$^{29}$Si and $^{13}$C NMR Spectrometry

NMR samples of resin linear products were prepared by weighing ~3 grams of solvent free resin linear (prepared by drying sample overnight at room temperature), 1 g of CDCl3, and 4 grams of 0.04M Cr(acac)$_3$ solution in CDCl$_3$ into a vial and mixing thoroughly. Samples were then transferred into a silicon-free NMR tube. Spectra were acquired using a Varian Mercury 400 MHz NMR. NMR samples of other materials such as 217 Flake and silanol terminated PDMS were prepared by diluting 4 g of sample into 4 grams of 0.04M Cr(acac)$_3$ solution in CDCl$_3$.

$^{13}$C NMR experiments were performed in the following manner. Samples were placed into 16 mm glass NMR tubes. A 5 mm NMR tube was placed inside the 16 nm tube and filled with lock solvent. 13C DEPT NMR was acquired in 12 or 20 minute signal averaging blocks. Data was acquired on a Varian Inova NMR spectrometer with a 1H operational frequency of 400 MHz.

Silanol content of resin linear products was calculated from the integration values of the T(Ph,OZ) and T(Ph,OZ2) regions in the 29Si NMR spectrum. T(Alkyl) groups were considered fully condensed (assumption) and subtracted from the T(Ph,OZ) region. The T(Alkyl) content was calculated by multiplying the integration value of D(Me$_2$) from $^{29}$Si NMR by the fraction (mols Si of coupling agent/mols Si of PDMS used in the synthesis formulation). Isopropoxy from 217 Flake was not subtracted out of the OZ values due to its low concentration. Therefore it was assumed that total OZ=total OH.

GPC Analysis

Samples were prepared in certified THF at 0.5% w/v concentration, filtered with a 0.45 um PTFE syringe filter, and analyzed against polystyrene standards. The relative calibration (3$^{rd}$ order fit) used for molecular weight determination was based on 16 polystyrene standards ranging in molecular weights from 580 to 2,320,000 Daltons. The chromatographic equipment consisted of a Waters 2695 Separations Module equipped with a vacuum degasser, a Waters 2410 differential refractometer and two (300 mm×7.5 mm) Polymer Laboratories Mixed C columns (molecular weight separation range of 200 to 3,000,000) preceded by a guard column. The separation was performed using certified grade THF programmed to flow at 1.0 mL/min., injection volume was set at 1004 and columns and detector were heated to 35° C. Data collection was 25 minutes and processing was performed using Atlas/Cirrus software.

To determine free resin content, the free resin peak at lower molecular weight was integrated to get the area percent.

Rheology Analysis

A commercially available rheometer from TA Instruments (ARES-RDA with 2KSTD standard flexular pivot spring transducer, TA Instruments, New Castle, Del. 19720) with forced convection oven was used to measure the storage modulus (G'), loss modulus (G") and tan delta as a function of temperature. Test specimens (typically 8 mm wide, 1 mm thick) were loaded in between parallel plates and measured using small strain oscillatory rheology while ramping the temperature in a range from 25° C. to 300° C. at 2° C./min (frequency 1 Hz).

To characterize the copolymers, the flow onset was calculated as the inflection temperature in the G' drop (labeled FLOW), the viscosity at 120° C. will be reported as a measure for melt processability and the cure onset was calculated as the inflection 30 temperature in the G' rise (labeled CURE).

A typical rheology curve on an organosiloxane copolymer is shown in FIG. 1. The results of the rheological evaluations of the representative examples disclosed herein, are summarized further below in Table 1.

Optical Clarity

Optical clarity was evaluated as the % transmission of light at wavelengths from about 350-1000 nanometers, measured through 1 mm thick samples of cast sheets of the present compositions. Generally, samples having a % transmittance of at least 95% were considered to be optically clear.

Tensile Strength and % Elongation

Tensile strength and % elongation at break were determined according to ASTM D412 using an Instron tester.

Tensile strength and % elongation were determined for samples as initially formed, as well as heat aged samples. The samples were heat aged by exposing the samples at 200° C. for 1000 hours in a forced air oven.

Thermal Stability

Thermal stability of organosiloxane copolymers was determined with Thermogravimetric Analysis (TGA) using a TA Instruments Q500. The samples were placed in a Pt pan and analyzed, with typical sample weights around 5 mg. The samples ramped to 800° C. were wrapped in Pt foil before analysis to prevent ejection. Samples were heated at 10° C./minute from room temperature to 800° C. in Air to determine the degradation temperature. Td(5%) is defined as the temperature at which 5% of the original sample weight is lost. Samples were also heated to 250° C. and held for 700 minutes. The slope of the weight loss curve (wt % as a function of time) is calculated and recorded as %/min in the 100 to 700 min time range. Also, total weight loss over 700 min of exposure to 250° C. and an Air atmosphere is recorded as 700 min loss in wt %.

Refractive Index

Refractive Index (RI) was measured according to ASTM D542.

Example 1

Reagents

|  | Target | Actual | Source |
|---|---|---|---|
| Phenyl-T Resin (FW = 137 g/mol Si) | 16.8 g |  | 16.9 g | D.C. 217 Flake |
| HO—(PhMeSiO$_{2/2}$)$_x$—H (FW = 136 g/mol Si) ~1.76 mol % OH | 43.2 g | 0.318 mols Si 0.00559 mols OH | 43.2 g |  |
| Methyl tris(methyl-ethylketoxime)silane (MTO) MW = 301.46 | 1.77 g | 0.00587 mols | 1.77 g | Gelest |
| Toluene | 111.4 g |  | 111.4 g | Fisher Scientific |

60 g solids

Procedure:

A 500 mL 3neck round bottom flask was loaded with toluene (71.4 g)+217 flake (16.9 g). The flask was equipped with a thermometer, teflon stir paddle, and a Dean Stark apparatus attached to a water-cooled condenser. A nitrogen blanket was applied. Dean Stark was prefilled with toluene. An oil bath was used for heating. Heated at reflux for 30 minutes. Cooled to 108° C. (pot temperature). A solution of toluene (40.0 g)+silanol terminated PhMe polymer (43.2 g) was capped with MTO. It was prepared in a glove box (same day) under nitrogen by adding MTO to the polymer and mixing at room temperature for 2 hours. The polymer solution was added to the 217 flake solution quickly at 108° C. Heated at reflux for 6.5 hrs. Films were cast from this solution.

Composition from NMR:
$D^{PhMe}_{0.722}T^{Me}_{0.013}T^{Ph}_{0.265}$OZ=7.11 mol %

Example 2

Reagents

|  | Target | Actual | Source |
|---|---|---|---|
| Phenyl-T Resin (FW = 137 g/mol Si) | 27.0 g | 0.197 mols Si | 27.1 g | D.C. 217 Flake |
| HO—(PhMeSiO$_{2/2}$)$_x$—H (FW = 136 g/mol Si) ~1.76 mol % OH | 33.0 g | 0.243 mols Si 0.00427 mols OH | 33.0 g |  |

-continued

| | Target | | Actual | Source |
|---|---|---|---|---|
| Methyl tris(methyl-ethylketoxime)silane (MTO) MW = 301.46 | 1.35 g | 0.00448 mols | 1.35 g | Gelest |
| Toluene | 111.4 g | | 111.4 g | Fisher Scientific |

60 g solids

Procedure:

A 500 mL 3neck round bottom flask was loaded with toluene (80.82 g)+217 flake (27.1 g). The flask was equipped with a thermometer, teflon stir paddle, and a Dean Stark apparatus attached to a water-cooled condenser. A nitrogen blanket was applied. Dean Stark was prefilled with toluene. An oil bath was used for heating. Heated at reflux for 30 minutes. Cooled to 108° C. (pot temperature). &solution of toluene (30.58 g)+silanol terminated PhMe polymer (33.0 g) was capped with MTO. It was prepared in a glove box (same day) under nitrogen by adding MTO to the polymer and mixing at room temperature for 2 hours. The polymer solution was added to the 217 flake solution quickly at 108° C. Heated at reflux for 3 hrs. Films were cast from this solution.

Composition from NMR:
$D^{PhMe}_{0.544}T^{Me}_{0.010}T^{Ph}_{0.446}OZ$=17.3 mol %

Example 3

Reagents

| | Target | | Actual | Source |
|---|---|---|---|---|
| Phenyl-T Resin (FW = 137 g/mol Si) | 33.0 g | 0.241 mols Si | 33.0 g | D.C. 217 Flake |
| HO—(PhMeSiO$_{2/2}$)$_x$—H (FW = 136 g/mol Si) ~1.76 mol % OH | 27.0 g | 0.199 mols Si 0.00349 mols OH | 27.0 g | |
| Methyl tris(methyl-ethylketoxime)silane (MTO) MW = 301.46 | 1.11 g | 0.00368 mols | 1.11 g | Gelest |
| Toluene | 111.4 g | | 111.4 g | Fisher Scientific |

60 g solids

Procedure:

A 500 mL 3neck round bottom flask was loaded with toluene (86.4 g)+217 flake (33.0 g). The flask was equipped with a thermometer, teflon stir paddle, and a Dean Stark apparatus attached to a water-cooled condenser. A nitrogen blanket was applied. Dean Stark was prefilled with toluene. An oil bath was used for heating. Heated at reflux for 30 minutes. Cooled to 108° C. (pot temperature).

A solution of toluene (25.0 g)+silanol terminated PhMe polymer (27.0 g) was capped with MTO. It was prepared in a glove box (same day) under nitrogen by adding MTO to the polymer and mixing at room temperature for 2 hours.

The polymer solution was added to the 217 flake solution quickly at 108° C. Heated at reflux for 3 hrs. Films were cast from this solution.

Composition from NMR:
$D^{PhMe}_{0.440}T^{Me}_{0.008}T^{Ph}_{0.552}OZ$=17.0 mol %

Example 4

Reagents

| | Target | | Actual | Source |
|---|---|---|---|---|
| Phenyl-T Resin (FW = 136.6 g/mol Si) | 216.0 g | 1.581 mols Si | 216.0 g | D.C. 217 Flake |
| HO—(PhMeSiO$_{2/2}$)$_x$—H (FW = 136.3 g/mol Si) 1.03 mol % OH | 264.0 g | 1.937 mols Si 0.0200 mols SiOH | 264.0 g | 60,000 cP Received January 2011 |
| 50/50 MTA/ETA Distilled Avg. FW = 231.2 g/mol Si | 43.16 g | 0.187 mols Si | 43.16 g | |
| Toluene | 720.0 g | | 720.0 g | Fisher Scientific lot# 106075 |

480 g solids, 33.63 g of acetic acid produced

Procedure:

A 2 L 3neck round bottom flask was loaded with toluene (544.0 g)+217 flake (216.0 g). The flask was equipped with a thermometer, teflon stir paddle, and a Dean Stark apparatus attached to a water-cooled condenser. A nitrogen blanket was applied. Dean Stark was prefilled with toluene. A heating mantle was used for heating. Heated at reflux for 30 minutes. Cooled to 108° C. (pot temperature). A solution of toluene (176.0 g)+silanol terminated PhMe siloxane (264.0 g) was capped with 50/50 MTA/ETA (4.84 g, 0.0209 mols Si). It was prepared in a glove box (same day) under nitrogen by adding the MTA/ETA to the polymer and mixing at room temperature for 2 hrs. The polymer solution was added to the 217 flake solution quickly at 108° C. Heated at reflux for 2 hrs. Cooled to 108° C. Added 50/50 MTA/ETA (38.32 g, 0.166 mols Si).

Heated at reflux for 2 hrs. Cooled to a pot temperature of 90° C. and then added DI water (33.63 g). Heated at reflux for 1 hr (no removal of water). Heated at reflux and removed water via azeotropic distillation. Bulk of water was removed in 1 hr. Continued to heat at reflux for 3 hrs. No more water was collecting in the Dean Stark at this time. Cooled to 100° C. and then added pre-dried Darco G60 carbon black (4.80 g).

Cooled to room temperature with stirring and then stirred overnight at room temperature. Pressure filtered through a 0.45 um filter.

Comparative Example 1

Reagents

| | Target | Actual | | Source |
|---|---|---|---|---|
| PhSiCl$_3$ | 82.95 g | 0.392 mols | 82.95 g | D.C. Z-1216 |
| PhMeSiCl$_2$ | 58.87 g | 0.308 mols | 58.87 g | D.C. Z-1221 |
| DI Water | | | | DC4 building supply |
| Toluene | 142.65 g | | 142.65 g | Fisher Scientific |

Theoretical Yield: 95.1 g @ 40 mol % OH
65.35 g HCl produced

Procedure:

A 1 L 3neck round bottom Intended Morton Type flask with a bottom drain was loaded with DI water (196.1 g). The flask was equipped with a thermometer, teflon stir paddle, and a water-cooled condenser. An addition funnel was loaded with $PhSiCl_3$ (82.95 g)+$PhMeSiCl_2$ (58.87 g)+toluene (142.65 g). Added chlorosilane solution slowly starting at room temperature. Exotherm to 78° C. Mixed for 15 min. Removed aqueous phase. Excellent separation. Removed HCl by water washing. Repeated the following process several times. Added 25 mL DI water, heated at 80° C. for 15 min. Removed aqueous phase. Heated to reflux and removed water via azeotropic distillation. Distilled off some solvent (96.5 g) to increase the solids content. Stripped resin to dryness using a rotavapor at an oil bath temperature of 120° C. and ~0.5 mm Hg.

Composition from NMR:
$D^{PhMe}_{0.437} T^{Cyclohexyl}_{0.007} T^{Ph}_{0.556} OH$=44.5 mol % (5.55 wt %); FW=136 g/mol Si The solid compositions containing the organosiloxane block copolymers as prepared in the above examples were then evaluated for their mechanical and RI properties. The results are summarized in Table 1 below.

TABLE 1

| | | | | | | Mechanicals | | |
| --- | --- | --- | --- | --- | --- | --- | --- | --- |
| Sample | Resin | Linear | RI | Tg, low °C. | Tg, high °C. | Tensile strength, MPa | Elongation at break, % | Flexibility |
| Example 1 | 28 wt % Ph-T | PhMe 100-150 dp | 1.553 | −18 | 50 | | | excellent |
| Example 2 | 45 wt % Ph-T | PhMe 100-150 dp | 1.558 | −19 | 40 | 4.6 | 236 | excellent |
| Example 3 | 55 wt % Ph-T | PhMe 100-150 dp | 1.56 | −15 | 50 | 8.5 | 26 | good |
| Example 4 | 45 wt % Ph-T | PhMe-D 100-150 dp | 1.558 | | | 4.3 | 195 | excellent |
| Comp. Example 1 | 55 wt % Ph-T | PhMe-D 1 dp | 1.56 | none | 19 | too brittle | too brittlle | poor |

The invention claimed is:

1. A solid composition comprising an organosiloxane block copolymer having 40 to 90 mole percent disiloxy units of the formula $[R^1_2SiO_{2/2}]$ 10 to 60 mole percent trisiloxy units of the formula $[R^2SiO_{3/2}]$ 0.5 to 25 mole percent silanol groups [≡SiOH]

where $R^1$ is independently a $C_1$ to $C_{30}$ hydrocarbyl, $R^2$ is independently a $C_1$ to $C_{20}$ hydrocarbyl, wherein;

the disiloxy units $[R^1_2SiO_{2/2}]$ are arranged in linear blocks having an average of from 10 to 400 disiloxy units $[R^1_2SiO_{2/2}]$ per linear block, the trisiloxy units $[R^2SiO_{3/2}]$ are arranged in non-linear blocks having a molecular weight of at least 500 g/mol, at least 30% of the non-linear blocks are crosslinked with each other, and are predominately aggregated together in nano-domains, each linear block is linked to at least one non-linear block, the organosiloxane block copolymer has a molecular weight of at least 20,000 g/mole, and the solid composition has a refractive index greater than 1.5.

2. The solid composition of claim 1 wherein the disiloxy units have the formula $[(CH_3)(C_6H_5)SiO_{2/2}]$.

3. The solid composition of claim 1 wherein the organosiloxane block copolymer contains at least 30 weight percent disiloxy units.

4. The solid composition of claim 1 wherein $R^2$ is phenyl.

5. The solid composition of claim 1 wherein the solid composition has a tensile strength greater than 1.0 MPa and an % elongation at break greater than 20%.

6. The solid composition of claim 1 wherein the coating composition has a melt flow temperature ranging from 25° C. to 200° C.

7. The solid composition of claim 1 wherein the composition has a storage modulus (G') at 25° C. ranging from 0.01 MPa to 500 MPa and a loss modulus (G") at 25° C. ranging from 0.001 MPa to 250 MPa.

8. The solid composition of claim 7 wherein the composition has a storage modulus (G') at 120° C. ranging from 10 Pa to 500,000 Pa and a loss modulus (G") at 120° C. ranging from 10 Pa to 500,000 Pa.

9. The solid composition of claim 7 wherein the composition has a storage modulus (G') at 200° C. ranging from 10 Pa to 100,000 Pa and a loss modulus (G") at 200° C. ranging from 5 Pa to 80,000 Pa.

10. The solid composition of claim 1 wherein the solid composition has an optical clarity of greater than 95% light transmittance.

11. The solid composition of claim 1 wherein the solid composition has a refractive index from about 1.5 to about 1.6.

12. The solid composition of claim 1 wherein the solid composition has a refractive index from about 1.50 to about 1.56.

* * * * *